US00RE35836E

United States Patent [19]

Rodriguez

[11] E Patent Number: Re. 35,836

[45] Reissued Date of Patent: Jul. 7, 1998

[54] SOLID STATE OPTICALLY COUPLED ELECTRICAL POWER SWITCH

[75] Inventor: Edward T. Rodriguez, Winchester, Mass.

[73] Assignee: C. P. Clare Corporation, Beverly, Mass.

[21] Appl. No.: 511,747

[22] Filed: Aug. 7, 1995

Related U.S. Patent Documents

Reissue of:

[64] Patent No.: 4,390,790
Issued: Jun. 28, 1983
Appl. No.: 186,419
Filed: Sep. 12, 1980

U.S. Applications:

[63] Continuation-in-part of Ser. No. 65,072, Aug. 9, 1979, Pat. No. 4,296,331.

[51] Int. Cl.[6] ..... G02B 27/00

[52] U.S. Cl. ..... 250/551; 327/514

[58] Field of Search ..... 250/551, 214 R, 250/214 SW; 327/509, 514

[56] References Cited

U.S. PATENT DOCUMENTS

| | | | |
|---|---|---|---|
| 3,321,631 | 5/1967 | Biard et al. . | |
| 3,524,986 | 8/1970 | Harnden, Jr. . | |
| 3,628,039 | 12/1971 | Ochs et al. . | |
| 3,693,060 | 9/1972 | Joyce . | |
| 3,708,672 | 1/1973 | Marinkovic . | |
| 3,805,094 | 4/1974 | Orlando | 307/300 |
| 3,976,877 | 8/1976 | Thillays . | |
| 3,995,174 | 11/1976 | Zrudsky | 307/240 |
| 4,054,801 | 10/1977 | Breval et al. . | |
| 4,112,308 | 9/1978 | Olschewski et al. . | |
| 4,124,860 | 11/1978 | Johnson . | |
| 4,129,785 | 12/1978 | Kadah . | |
| 4,166,224 | 8/1979 | Hutson . | |
| 4,170,740 | 10/1979 | Pernyeszi . | |
| 4,227,098 | 10/1980 | Brown et al. | 307/311 |
| 4,268,843 | 5/1981 | Brown et al. . | |
| 4,275,308 | 6/1981 | El Hamamsy . | |
| 4,303,831 | 12/1981 | El Hamamsy . | |
| 4,307,298 | 12/1981 | El Hamamsy et al. . | |
| 4,323,799 | 4/1982 | King et al. | 307/571 |
| 4,459,498 | 7/1984 | Stengl et al. . | |
| 4,777,387 | 10/1988 | Collins | 250/551 |
| 4,931,656 | 6/1990 | Ehalt et al. | 250/551 |
| 5,408,102 | 4/1995 | Okumura | 327/514 |

FOREIGN PATENT DOCUMENTS

| | | |
|---|---|---|
| 2910748 A1 | 9/1979 | Germany . |
| 30 00 890 | 9/1980 | Germany . |
| 3000890 A1 | 9/1980 | Germany . |
| Sho 55-1756 | 1/1980 | Japan . |
| 2 017 297 A | 3/1979 | United Kingdom . |

OTHER PUBLICATIONS

"Designs for VMOS Push–Pull Converters," *Electronic Engineering*, MAy 1980, pp. 87–93, Regan et al.

*Primary Examiner*—Stephone Allen
*Attorney, Agent, or Firm*—Lappin & Kusmer LLP

[57] ABSTRACT

Solid state optically coupled power switch with light induced or modified voltage applied or removed at one or more MOSFET gate and source electrode pairs to shift each MOSFET between its high and low impedance states and in various circuit arrays for ac or dc switching and/or cross points switching or mechanical Form C relay substitution or other purposes

23 Claims, 5 Drawing Sheets

FIG. 8
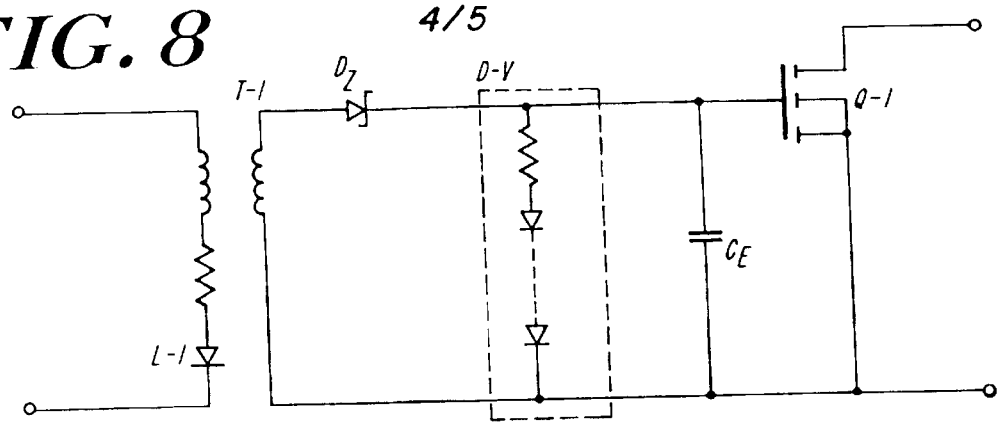
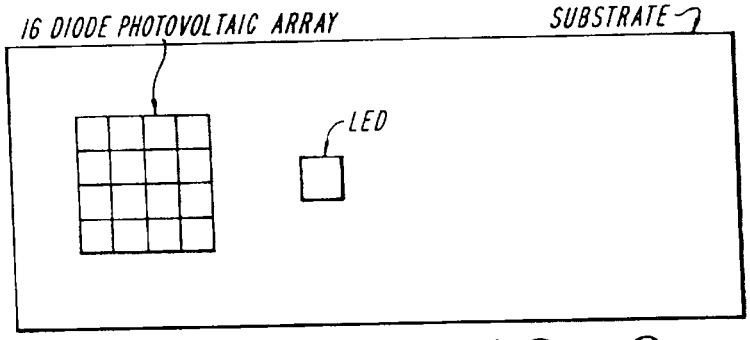
FIG. 9
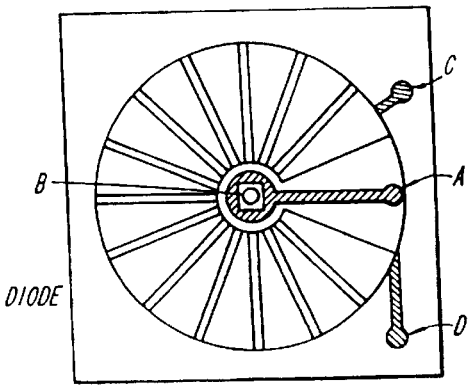
FIG. 10A
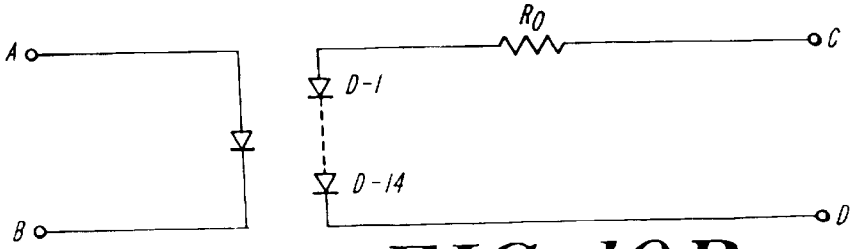
FIG. 10B

EQUIVALENT CIRCUIT

SOLID STATE OPTICALLY COUPLED ELECTRICAL POWER SWITCH

Matter enclosed in heavy brackets [ ] appears in the original patent but forms no part of this reissue specification; matter printed in italics indicates the additions made by reissue.

*RELATED U.S. APPLICATIONS*

*This application is a reissue application of U.S. Pat. No. 4,390,790, based on U.S. patent application Ser. No. 186, 419, filed Sep. 12, 1980, by Edward T. Rodriguez, which in turn is a continuation-in-part of U.S. patent application Ser. No. 65,072, filed Aug. 9, 1979, now U.S. Pat. No. 4,296,331.*

BACKGROUND OF THE INVENTION

This invention relates to solid state switching devices employing optical isolation. Depending on the application and power level, these devices can be characterized as solid state relays (SSR's) or analog switches. In the invention, field-effect transistor (FET) technology is combined with certain optoelectronic means alone or supplemented by electromagnetic means to achieve both superior switching characteristics and fabrication means compatible with low-cost mass production.

It is common in the electronics industry, particularly in modern telecommunications, test or computer equipment, to have control circuits operating at different voltage levels from load circuits. For example, it is common to operate 120 VAC industrial machines or 48 VDC telephone apparatus from 5 VDC computer logic.

As a result, the need arises to transfer data or control signals between such dissimilar voltage references without physically connecting the two circuits, i.e. with isolation.

In the evolving 1960's and 1970's state of the art, the isolation functions have had increasingly stringent criteria of miniaturization, long life under repetitive conditions, and low operating power. Satisfying a large part of these needs are four categories of isolated switching elements:

(a) Optical Couplers

These are generally low current (under 100 mA) elements employing an LED as a light emitter and a variety of semiconductor types as the sensor.

(b) Solid State Relays (SSR's) with Optical Isolation

These generally employ an internal optical coupler in combination with other semiconductor elements to switch power.

(c) Solid State Relays with Transformer Isolation (d) Reed Relays

While the primary purpose of couplers is only to isolate, the purpose of reed relays and SSR's is not only to isolate but also to provide power gain.

Over the past ten years, as isolators and SSR's have achieved a degree of maturity and widespread acceptance, it has also become apparent that a variety of limitations exist.

For example, couplers generally are limited in current and voltage. They are usually limited to DC loads and are particularly susceptible to damage when switching inductive loads or when operating in an overload current mode. Furthermore, they exhibit a voltage offset of about one volt because of the use of bipolar photo-semiconductors. This means that voltages under one volt cannot be switched and that audio signals cannot be faithfully reproduced without the use of biasing.

While SSR's can offer considerable power gain and isolation, they are generally relegated to being designed for AC or DC operation, but not both. Also, an AC-load SSR employing a thyristor as the output element is subject to false latchup. In any event, such an SSR is not capable of being turned off in mid-cycle.

Reed relays experience difficulties with reactive loads and, although faster than conventional mechanical relays, are still slower than solid state switches. Also, reed relays are limited in the degree they can switch momentarily high currents or voltages. Finally, under very high switching rates, their mechanical life has a severe limitation.

Because or these limitations, increasing attention is being given to field effect transistors (FETs). Modern FETs offer the absence of significant voltage offset and thermal run-away effects, extremely high power gain, ability to operate at very high frequencies, and under appropriate conditions, the ability to switch AC or DC with equal ease.

The idea of FET switches for relay-type functions and related developments go back to as early as 1955 and have been made since by several skilled laboratories.

In spite of these many efforts going back over two decades, optically activated FET power switches have not proven commercially significant because of their inability to meet the specific cost and performance requirements of certain defined industrial and telecommunications applications.

It is a principal object of the invention, therefore, to provide commercially useful, optically isolated power FET switches capable of 1. operating at low (millivolt) or high (above 300 V) load voltage,
2. operating at low (picoamps) or high (above several amperes) current,
3. switching DC of either polarity or AC up to at least 100 KHz (i.e., capability of sub-microsecond switching speeds),
4. immunity to false latchup (as with thyristors),
5. immunity to secondary breakdown (as with bipolar transistors),
6. switching speeds controllable over wide range (for switching transient control),
7. operating from very low input signals,
8. operating at high temperature,
9. being readily arranged in series or parallel arrays for extended current or voltage capability,
10. duplicating the break-before-make configuration of Form C mechanical relays,
11. exhibiting ON resistance under 100 milliohms and OFF resistance over 10,000 megohms so to approach the isolation of reed relays.

SUMMARY OF THE INVENTION

In accordance with the invention, a light emitting means—e.g., a diode (LED) chip—is placed adjacent to a photovoltaic device—e.g., an integrated circuit sensor chip. When activated by light from the LED, the photovoltaic device becomes a voltage source (of at least 8 volts). This voltage is applied between the source and gate of a power MOSFET transistor, thereby causing the transistor's impedance to change from many megohms down to a few ohms. The photovoltaic integrated circuit chip may contain 16 diodes connected in series with connections at either end or the midpoint of the series string. A low voltage MOSFET may be used to enhance the overall unit's switching speed.

Light is coupled from the LED to the sensor through a thin, clear film. Coupling is by refractive means, as described in the above-cited U.S. application. The diode string, when activated by light, generates slightly more than 0.5 volts per diode, or slightly above 8 volts total.

The chosen sensor chip size can deliver only several micro-amperes. (Larger chips could, of course, deliver more current.) However, this is adequate to drive the gate of the FET because of its high input impedance. The junction FET source and drain are across the sensor and the parallel output FET source and gate. When the sensor is activated, the FET is pinched off, allowing the [snesor] *sensor* to deliver full current to the output chip. When the light is removed, the FET is no longer pinched off and drops to a low impedance. This, in turn, serves to significantly speed up turnoff time of the output device.

The light emitter may consist of a liquid epitaxy gallium or gallium aluminum arsenide LED to provide greater brightness than a simple diffused LED. The sensor diode array is fabricated using dielectric isolation techniques. This eliminated parasitic light-generated voltages which could exist at various PN junctions if conventional isolation-diffusion integrated circuit processing were used.

The output consists of a pair of vertical-conduction, double-diffused enhancement-mode MOS chips (sometimes referred to as vertical DMOS). The use or depletion mode MOS output chips would result in a normally on switching device which would turn off when driven by the photovoltaic chip. The output chips are connected in relation to each other and the sensor chip such that a two terminal output is created that is capable of switching or blocking high voltage AC or DC.

Other objects, features and advantages of the invention will be apparent from the following detailed description of preferred embodiments thereof taken in connection with the accompanying drawing, in which,

BRIEF DESCRIPTION OF THE DRAWING

FIGS. 1A, 1B, 1C, 6, 7, 8, *10B* and 11 are circuit diagrams of preferred embodiments or the invention;

FIGS. 2, 3, 5, 9, 10A, [10B] and 10C are plan or cross section views of physical constructions usable in one or more of said circuits.

DETAILED DESCRIPTION OF PREFERRED EMBODIMENTS OF THE INVENTION

Figure 1A:
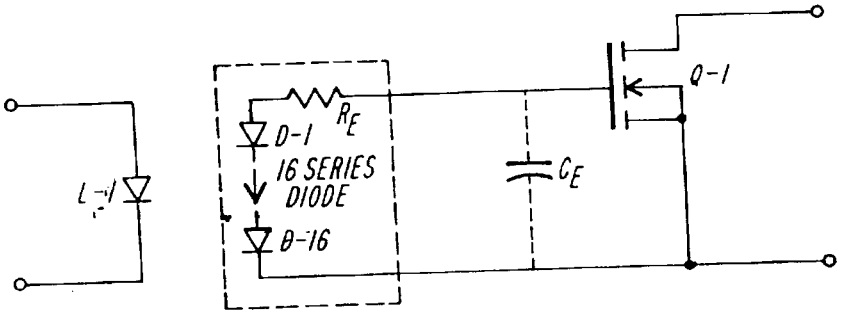
Figure 2:
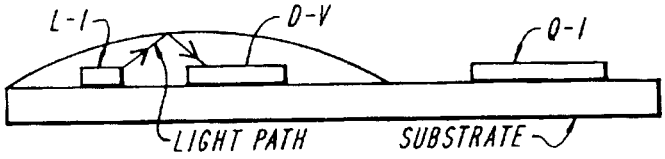
Figure 3:
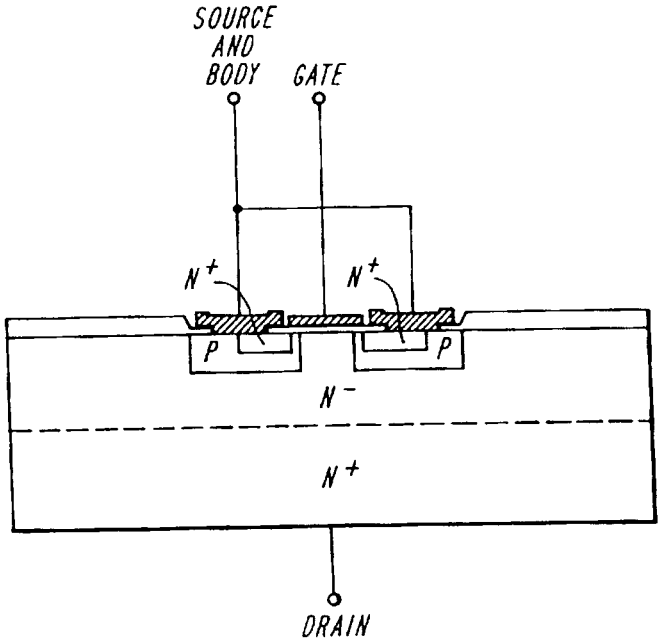

FIG. 1A shows a simple form of the invention in which LED, L-1, activated by a control current of about 10 mA, generates infrared radiation which is sensed simultaneously by integrated diode array, D-V. FIG. 2 depicts the coupling method. The output of D-V is connected as shown to the gate and source of a MOSFET Q-1. The cross-sectional geometry of Q-1 is shown in FIG. 3. Q-1 exhibits an equivalent capacitance, $C_E$, between gate and source of the MOSFET. This capacitance is on the order of several dozen picofarads for a chip 0.050 inches by 0.050 inches.

When D-V is activated, $C_E$ charges to the D-V generated voltage through the D-V series equivalent resistance, $R_E$, which, for the chosen sensor chip of about 0.040 inches by 0.040 inches, is about 1 Megohm.

Figure 4:
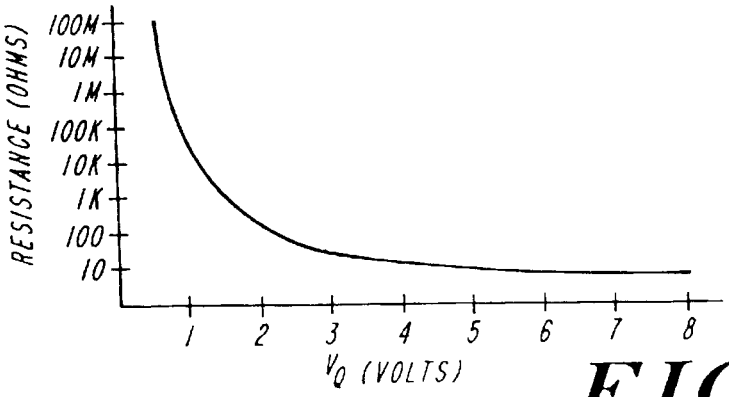
FIG. 4 is a voltage vs. on-resistance trace for an operating example of the present invention.

Turn-on time for Q-1, is the time it takes for $C_E$ to charge to a high enough voltage to where Q-1 has approached its lowest ON resistance. In this case, two $R_E/C_E$ time constants put Q-1 gate voltage above 6 volts, a value where Q-1 is essentially full on. FIG. 4 depicts the effect of gate voltage on ON resistance.

It may take, for example, about 20–50 microseconds to charge $C_E$ and turn on Q-1. When the signal to L-1 is removed, D-V stops generating a voltage. However, the charge remains on $C_E$, thereby holding Q-1 on until stray leakage paths eventually provide a discharge of $C_E$. Since several seconds could be required for discharge, alternate means for faster turn-off are normally required.

Figure 1B:
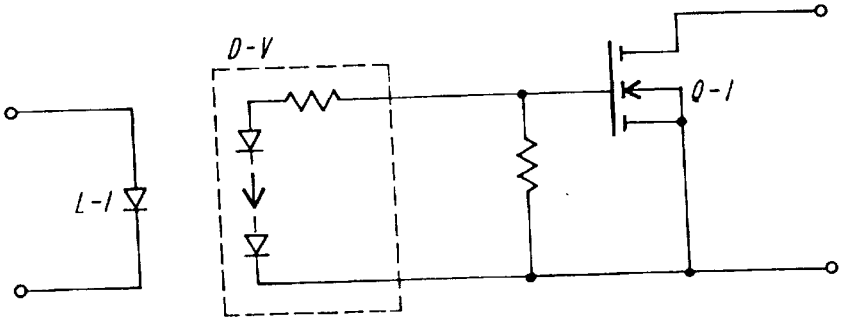

Placing a bias resistor of several [megonms] *megaohms* as shown in FIG. 1B speeds the discharge of $C_E$, but has the effect of increasing turn-on time. This is acceptable where switching speed is not critical. Dropping R to an even lower value would theoretically discharge $C_E$ in 20–50 microseconds but can unfortunately load down D-V excessively to where full or adequate turn-on does not exist.

Figure 1C:
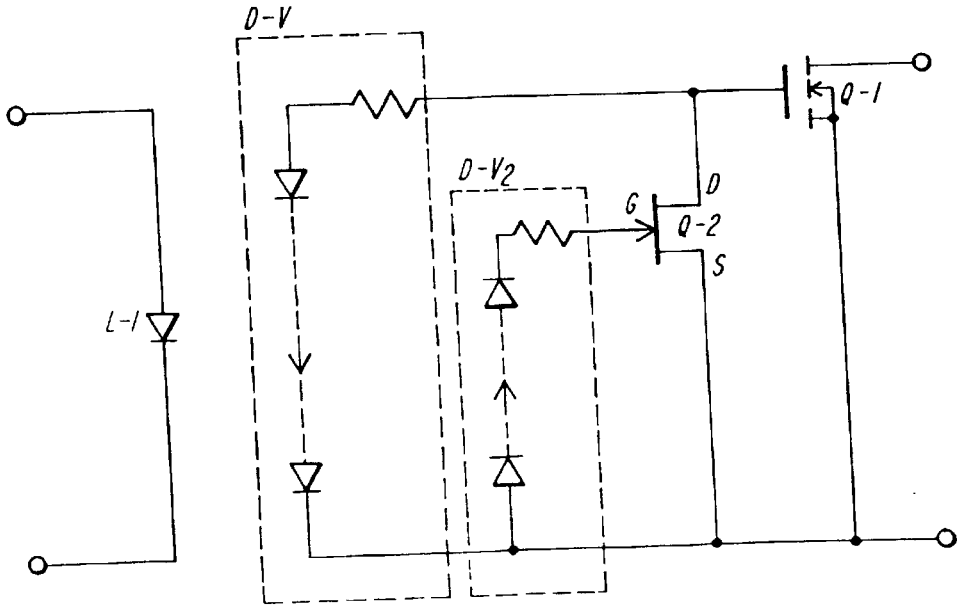

The ideal arrangement, then, is one where the full D-V voltage is applied during turn-on with minimal biasing, but where maximum biasing is attained during turnoff. Such an arrangement is provided in the embodiment of the invention illustrated in FIG. 1C, where the bias resistor is replaced by an N-channel depletion mode junction FET, Q-2.

A second diode array, D-$V_2$, is connected to the gate of Q-2. Q-2, being a depletion mode FET, is normally in a low impedance state, well under 1,000 ohms. When L-1 activates D-$V_2$, Q-2 sces D-$V_2$ total voltage at its gate, causing Q-2 to rapidly be "pinched off" to a high impedance, thereby allowing enhanced turn-on time.

When L-1 is deactivated, D-$V_2$ voltage collapses and Q-2 is no longer pinched off and drops to a low impedance, thereby causing rapid $C_E$ discharge and Q-1 turn-off.

Photovoltaic diode generators, D-V and D-$V_2$, and FET, Q-2, are fabricated on the same chip using dielectric isolation. Each diode is electrically isolated from the next except for surface interconnect metallurgy, which proceeds from one anode to the next cathode. The oxide "tub" surrounding each diode prevents electrical interaction except between the P and N regions of each diode except through surface interconnect metalization.

Such an array produced by conventional integrated circuit diffusion isolation technology would result in undesirable photovoltaic action at each isolation junction, cancelling out the desired effects. The dielectric process provides near perfect isolation and eliminates the many external-wire connections associated with individual diode chips. It also provides the maximum diode element location concentration for receiving light from L-1.

Figure 5:
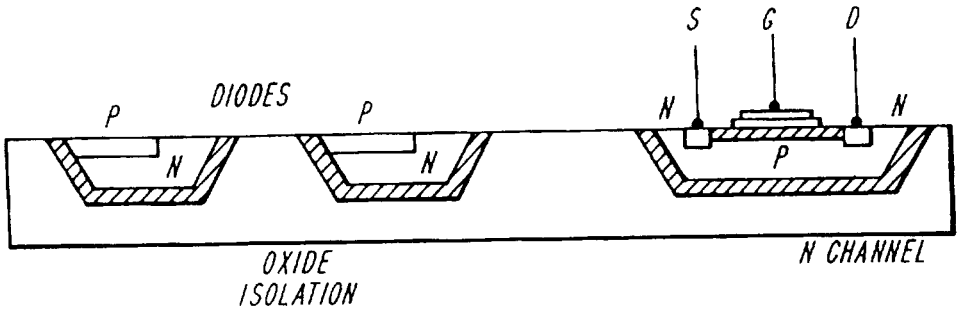
Figure 6:
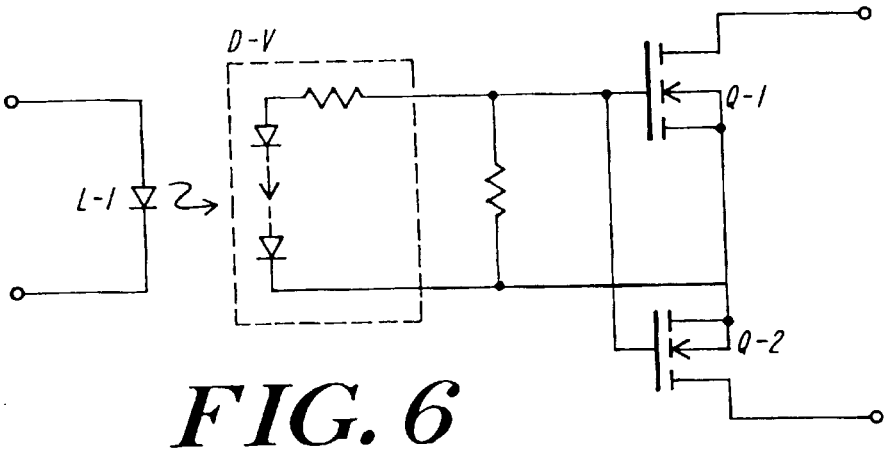

FIG. 5 depicts the cross-sectional geometry of the diodes and the bias FET, Q-2. While FIGS. 1A, 1B and 1C reflect basic configurations, a more preferred embodiment of the invention for many practical applications is shown in FIG. 6. In the FIG. 6 circuit, the voltage generated by D-V is simultaneously applied to the gates and sources of Q-1 and Q-2, which are connected source-to-source. In operation, Q-1 and Q-2 can each block voltage in one direction, but can withstand only about one volt in the reverse direction. In FIG. 6, however, either Q-1 or Q-2 is always in the full blocking mode, thereby blocking load voltage regardless of the polarity.

With the vertical DMOS structure, the conductivity is modulated with either polarity of load voltage. Hence, with a relatively high AC load voltage, either Q-1 or Q-2 bears the majority of the blocking requirement, but both drop to a low impedance with an L-1 signal. The final ON resistance, then, is the sum of Q-1 and Q-2.

In this approach, no steering diodes are required and, therefore, an ideal condition of no voltage offset is maintained. The elimination of steering diodes means that dissipation and signal distortion are minimized. Furthermore, high voltage AC (above 300 V) switching can be achieved. (Steering diodes or the low forward drop of Schottky or gold-doped type are not available today in high-voltage, low-leakage versions.)

It has been noted that the use of a depletion mode FET such as Q-2 can enhance turn-off. It can also be noted that the addition of a photovoltaically activated FET, Q-2, as in FIG. 7, can enhance turn-on speed as follows:

L-1 is so arranged as to simultaneously activate D-V. The reduced impedance of Q-2 causes Q-1 gate capacitance to suddenly begin charging toward $V_B$ through Q-2. Q-2 has an input capacitance much smaller than that of Q-1 by an order to magnitude equal to the degree of turn-on speed enhancement. Since Q-2 handles negligible current, it can be a much smaller chip than Q-1, thereby facilitating a geometry contributing less capacitance.

The result is the rapid charge of Q-1 gate capacitance and faster turn-on, which could not occur were gate capacitance to charge directly through the high impedance D-V voltage source.

With the preceding means for turn-on and the means of FIG. 1-C for turn-off, it is possible to fabricate a bidirectional, distortion-free AC power amplifier or switch capable of operating at frequencies above 1 Megahertz.

Unlike thyristors, the switch exhibits no regenerative mechanism and hence, cannot be latched on by a voltage transient.

Figure 7:
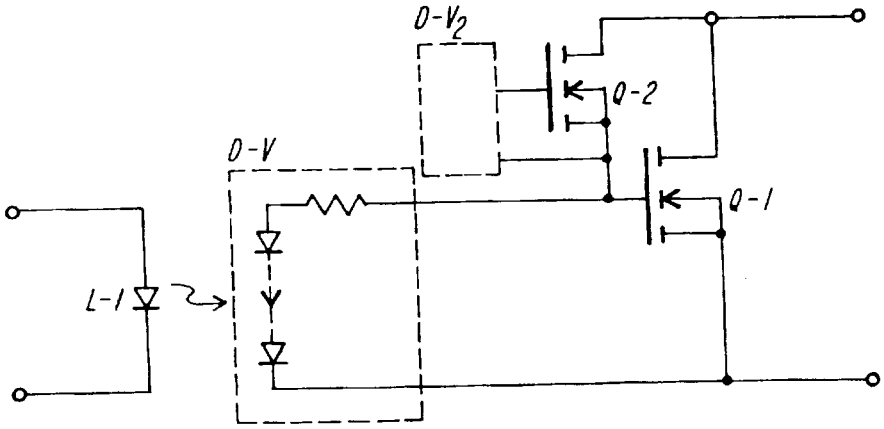

With vertical DMOS technology, it is possible to integrate all elements, except for the LED, on a single chip using dielectric isolation technology. The single chip would include the photovoltaic diodes (FIG. 7).

The circuit of FIG. 8 comprises a unique configuration in which transformer action augments the isolated photovoltaic drive scheme in order to achieve very fast turn-on and turn-off times.

In the FIG. 8 circuit, a LED is in parallel with the primary of a pulse transformer T-1. When the input signal abruptly rises to a positive level, LED-1 is illuminated. This would [noramlly] *normally* cause voltage generator, D-V to begin charging $C_E$, in turn causing Q-1 to turn on in a time comparable to the time constant of $C_E$ and internal equivalent resistance of $V_G$.

However, the rise in input signal is seen at the secondary of T-1 as a positive pulse which rapidly charges $C_E$ through forward biased zener diode, $D_Z$. Once the input signal reaches an on-quiescent state, the positive pulse at the T-1 secondary disappears, but the charge on $C_E$ [in] *is* maintained by D-V.

When the input signal drops to zero, L-1 ceases its illumination and D-V discharge through available leakage paths, or, if one were connected, a gate-to-source bias resistor. Turn-off time under this condition would, in certain applications, be excessive.

With transformer augmentation, the loss of input signal and cessation of T-1 primary current not only causes L-1's output to cease, but also causes a negative pulse to appear at the T-1 secondary, causing $D_Z$ to break over in the reverse direction, effectively grounding the gate of Q-1. As a result, $C_E$ is discharged, abruptly causing extremely fast Q-1 to turn-off.

FIG. 8 depicts a similar configuration in which Q-1 and Q-2 are connected to form an AC switch with high-speed drive circuit. It is desirable in the circuits of FIG. 8 that the zener diode be specified at a voltage approximately equal to that of the photovoltaic generator and that the voltage appearing at the secondary of T-1, especially at turn-off, be greater than the breakdown voltage of $D_Z$.

The result is a magnetically and optically isolated switch capable of switching speeds on the order of hundreds of nanoseconds or better. Since the T-1 is needed only during switching and depends on D-V during the on period, T-1 can be sharply reduced in size.

In various prior art technologies, it his been demonstrated that a DC voltage could be used to operate an oscillator. The oscillator's high frequency output could be transformer coupled, rectified, filtered and applied to a transistor base or FET gate to turn it on.

Such approaches, however, are more complex and introduce filter-induced delays along with an oscillation signal which can be undesirable, particularly when switching low-level or high-frequency signals.

The circuit of FIGS. 1, 6, 7 and 8 provide simplified switching without the hazard of spurious signals or beat frequencies.

While the primary mode of fabrication is based on thick film hybrid circuit technology, variations of the preceding circuits can, with the exception of the LED's, be readily fabricated totally on a single integrated circuit chip; in particular, by means of dielectric isolation technology. An IC employing the LEDS's, as well, is compatible with present knowledge of processing techniques, but is not yet economically feasible. Such a chip for example could be fabricated having all elements fabricated with Gallum Arsenide rather than having the diode and FET's processed with silicon as is currently the practice.

A major consideration in activating the photovoltaic array is that the maximum output current can be no greater than the current generated by the least illuminated diode in the series string. In a straightforward matrix of series-connected diodes (FIG. 9), the diode farthest from the LED becomes a limiting factor. For comparable efficiency (comparable impedance in the illuminated state), the diode area should be larger as the distance from the LED increases.

Figure 10C:
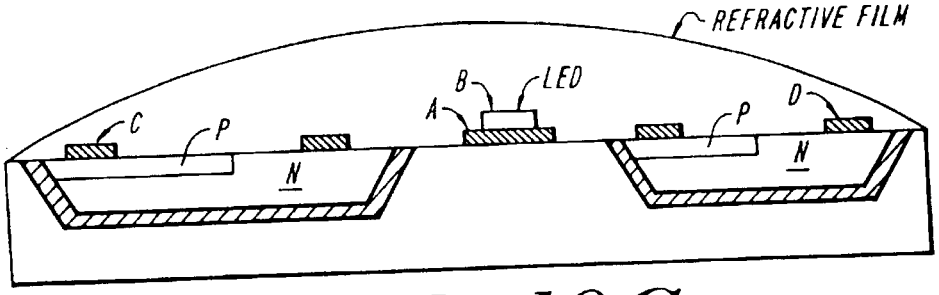

The optimized configuration, then, for a series string of photovoltaic diodes is the "wagon wheel" configuration of FIG. 10A (the equivalent circuit of which is shown in FIG. 10B and a cross-section of which is shown in FIG. 10C), with the LED mounted in the center so as to equally illuminate all diodes. The wagon wheel surface geometry, coupled with the hemispherical refractive film, provides maximum response to the LED hemispherical radiation pattern across the entire surface of each diode.

Figure 11:
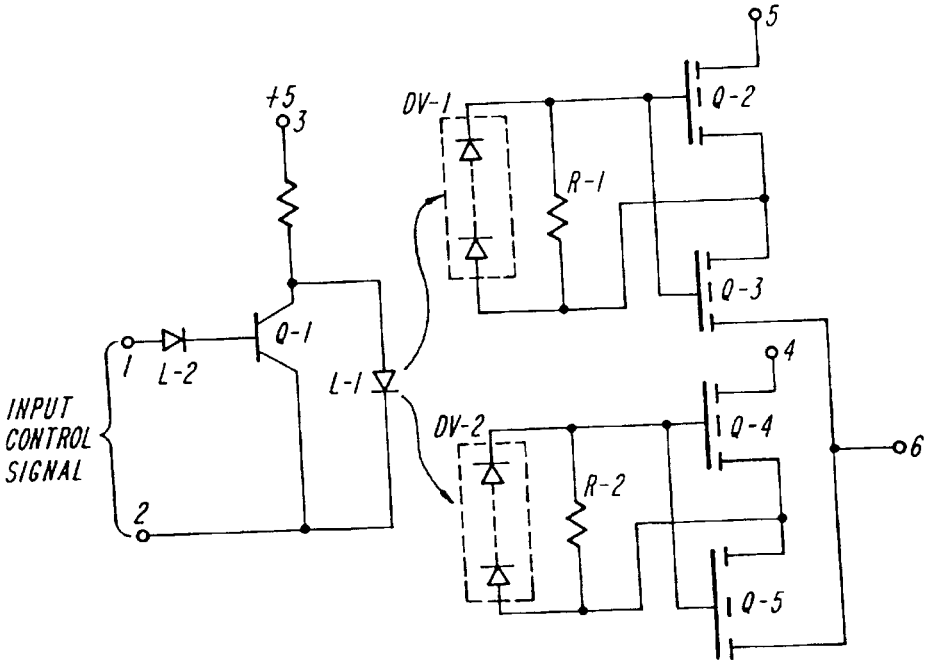
FIG. 11A is an equivalent circuit diagram of the circuit of FIG. 11.

FIG. 11 depicts such a circuit, capable of switching AC or DC, in which the switching elements are depletion mode V-MOS chips. Bias resistors R-1 and R-2 are selected to be above 5 [megohm] *megaohms*. The result is that when the photovoltaic generators DV-1 or DV-2 are activated, turnoff is rapid because of minimal shunt resistance. Turn-on is slower because of the slow discharge of MOSFET gate capacitance through the large bias resistor value.

In the circuit shown, LED, L-1, is normally on, thereby maintaining Q-2 and Q-3 in an OFF condition. When a control signal is applied to terminal 1, Q-1 becomes saturated, thereby shunting current around L-1. Base current to Q-1 passes through L-2, thereby rapidly turning off Q-4 and Q-5 before Q-2 and Q-3 turn on. When the control signal is removed, L-1 initiates rapid turn off of Q-2 and Q-3 before Q-4 and Q-5 turn on.

Figure 11A:
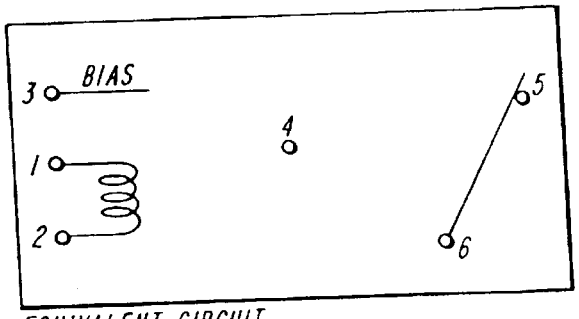

FIG. 11A shows the equivalent circuit for such a physical circuit as shown in FIG. 11.

It is evident that those skilled in the art, once given the benefit of the foregoing disclosures, may now make numerous other uses and modifications of, and departures from, the specific embodiments described herein without departing from the inventive concepts. Consequently, the invention is to be construed as embracing each and every novel feature and novel combination of features present in, or possessed by, the apparatus and techniques herein disclosed and limited solely by the scope and spirit of the appended claims.

What is claimed is:

[1. A solid state optically-coupled relay comprising, (a) solid state light emitting means, (b) principal solid state photodetector means comprising a first diode series array optically controllable by the light emitting means, (c) output terminal means, (d) an enhancement-mode vertical conduction (DMOS) MOSFET, constituting an output FET of the relay switch with gate, source and drain electrodes, the source and drain electrodes thereof being connected to said output terminal means and the source and gate electrodes being connected directly to the ends of the first diode array.]

2. A solid state optically-coupled relay comprising, (a) solid state light emitting means, (b) principal solid state photodetector means comprising a first diode series array optically controllable by the light emitting means, (c) output terminal means, (d) an enhancement-mode vertical conduction (DMOS) MOSFET, constituting an output FET of the relay [switch] with gate, source and drain electrodes, the source and drain electrodes thereof being connected to said output terminal means and the source and gate electrodes being connected directly to the ends of the first diode array, (e) a depletion-mode junction FET (JFET) with source, drain and gate electrodes [of the DMOS and] the gate and source electrodes of the JFET being connected to the ends of the second diode array, the JFET providing a maximum turn-off bias to the DMOS when the JFET is at a low impedance, such low impedance condition of the JFET occurring when the second diode array is not illuminated, the JFET providing a turn on bias to the DMOS when the JFET is at a high impedance, such high impedance occurring when the second diode array is illuminated.

3. [Relay switch apparatus in accordance with either of claims 1 or 2] *A solid state optically-coupled relay comprising,*

*(a) solid state light emitting means,*

*(b) principal solid state photodetector means comprising a first diode series array optically controllable by the light emitting means,*

*(c) output terminal means,*

*(d) an enhancement-mode vertical conduction (DMOS) MOSFET, constituting an output FET of the relay with gate, source and drain electrodes, the source and drain electrodes thereof being connected to said output terminal means and the source and gate electrodes being connected directly to the ends of the first diode array;*

*wherein said relay is* in directional configuration with two such output FETs connected on series opposition, the source electrodes of said two FETs being directly connected and the gate electrodes of said two FETs being directly connected.

4. [Relay switch apparatus in accordance with any of claims 1 or 2] *A solid state optically-coupled relay comprising,*

*(a) solid state light emitting means,*

*(b) principal solid state photodetector means comprising a first diode series array optically controllable by the light emitting means,*

*(c) output terminal means,*

*(d) an enhancement-mode vertical conduction (DMOS) MOSFET, constituting an output FET of the relay with gate, source and drain electrodes, the source and drain electrodes thereof being connected to said output terminal means and the source and gate electrodes being connected directly to the ends of the first diode array;* wherein the diode array and light emitting means are arranged in the same plane and further comprising*:*

*(e)*[(f)] thin film means overlying the array and emitting means and providing a refractive optical coupling path therebetween.

5. A solid state optically coupled relay comprising, (a) solid state light emitting means, (b) principal solid state photodetector means comprising a first diode series array optically controllable by the light emitting means, (c) output terminal means, (d) a depletion-mode vertical conduction (DMOS) MOSFET, constituting an output FET of the relay [switch] with gate, source and drain electrodes, the source and drain electrodes thereof being connected to said output terminal means and the source and gate electrodes being connected directly to the ends of the first diode array, (e) a depletion mode bias FET with source, drain and gate electrodes, (e') source and drain electrodes of the bias FET being connected to the drain and gate electrode of the output FET, (e") source and gate electrodes of the bias FET being connected to ends of the diode array.

*6. A solid state optically-coupled relay comprising,*

*(a) solid state light emitting means,*

*(b) principal solid state photodetector means comprising a first diode series array optically controllable by the light emitting means,*

*(c) output terminal means,*

*(d) an enhancement-mode vertical conduction (DMOS) MOSFET, constituting an output FET of the relay with gate, source and drain electrodes, the source and drain electrodes thereof being connected to said output terminal means and the source and gate electrodes being connected directly to the ends of the first diode array;*

*(e) a depletion-mode junction FET (JFET) with source, drain and gate electrodes, the gate and source electrodes of the JFET being connected to the ends of the second diode array,*

*wherein said relay is in directional configuration with two such output FETs connected on series opposition, the source electrodes of said two FETs being directly connected and the gate electrodes of said two FETs being directly connected.*

*7. A solid state optically-coupled relay comprising,*

(a) solid state light emitting means, (b) principal solid state photodetector means comprising a first diode series array optically controllable by the light emitting means, (c) output terminal means, (d) an enhancement-mode vertical conduction (DMOS) MOSFET, constituting an output FET of the relay with gate, source and drain electrodes, the source and drain electrodes thereof being connected to said output terminal means and the source and gate electrodes being connected directly to the ends of the first diode array;

(e) a depletion-mode junction FET (JFET) with source, drain and gate electrodes, the gate and source electrodes of the JFET being connected to the ends of the second diode array, wherein the diode array and light emitting means are arranged in the same plane and further comprising:

(f) thin film means overlying the array and emitting means and providing a refractive optical coupling path therebetween.

8. A solid state optically-coupled relay comprising, (a) solid state light emitting means, (b) principal solid state photodetector means comprising a first diode series array optically controllable by the light emitting means, (c) output terminal means, (d) an enhancement-mode vertical conduction (DMOS) MOSFET, constituting an output FET of the relay with gate, source and drain electrodes, the source and drain electrodes thereof being connected to said output terminal means and the source and gate electrodes being connected directly to the ends of the first diode array, and (e) a bias switching device connected between the gate and source electrodes of the output FET, the gate and source electrodes having an equivalent capacitance therebetween, the bias switching device being operable in a first mode so as to provide a relatively high impedance path between the gate and source electrodes of the output FET when the light emitting means is illuminated and in a second mode so as to provide a relatively low impedance path between the gate and source electrodes of the output FET when the light emitting means is not illuminated, such that the turn-on of the output FET takes place with a time constant substantially determined by the equivalent capacitance between the gate and source electrodes of the output FET and the impedance path of the bias switching device.

9. A solid state optically-coupled relay comprising, (a) solid state light emitting means, (b) principal solid state photodetector means comprising a first diode series array optically controllable by the light emitting means, (c) output terminal means, (d) an enhancement-mode vertical conduction (DMOS) MOSFET, constituting an output FET of the relay with gate, source and drain electrodes, the source and drain electrodes thereof being connected to said output terminal means and the source and gate electrodes being connected directly to the ends of the first diode array, and (e) a bias switching device connected across the gate and source electrodes of the output FET, the gate and source electrodes having an equivalent capacitance therebetween, the bias switching device being operable in a first mode so as to provide a relatively high impedance path between the gate and source electrodes of the output FET when the light emitting means is illuminated and in a second mode so as to provide a relatively low impedance path between the gate and source electrodes of the output FET when the light emitting means is not illuminated, such that the turn-off of the output FET takes place with a time constant substantially determined by the equivalent capacitance between the gate and source electrodes of the output FET and the impedance path of the bias switching device.

10. A relay according to claim 9, wherein the bias switching device is a transistor.

11. A relay according to claim 10, wherein the bias switching device is a JFET.

12. A relay according to claim 10, wherein the bias switching device is a depletion-mode JFET.

13. A relay according to claim 9, wherein the inherent turn-off time of the output FET, when unbaised, is a function of the time it takes to discharge the equivalent capacitance, wherein the turn-off time of the output FET in response to the change of the bias switching device from the second mode of operation to the first mode of operation is faster than the inherent turn-off time of the unbiased output FET.

14. A relay according to claim 9, further including means for biasing said bias switching device.

15. A relay according to claim 14, wherein said means for biasing said bias switching device includes a diode string.

16. A relay according to claim 15, wherein the diode string biases the bias switching device to the second mode of operation when the light emitting means is illuminated.

17. A solid state optically-coupled relay comprising, (a) solid state light emitting means, (b) principal solid state photodetector means comprising a first diode series array optically controllable by the light emitting means, (c) output terminal means, (d) an enhancement-mode vertical conduction (DMOS) MOSFET, constituting an output FET of the relay with gate, source and drain electrodes, the source and drain electrodes thereof being connected to the output terminal means and the source and gate electrodes being connected directly to the ends of the first diode array, the output FET being characterized as (i) having an equivalent capacitance between the source and gate electrodes of the output FET so that the inherent turn-on time of the out FET, when unbiased, is a function of the time it takes to charge the equivalent capacitance and (ii) being operable between an ON state wherein the signal path between the source and drain electrodes of the output FET is a relatively low impedance path and an OFF state wherein the signal path between the source and drain electrodes of the output FET is a relatively large impedance path, and (e) a biasing switch connected between the source and gate electrodes of the output FET, the bias switch being operable in a first mode to provide a relatively low impedance path between the source and gate electrodes of the output FET when the light emitting means is not illuminated so as to maintain the output FET in an OFF state, and in a second mode to provide a relatively high impedance path between the two electrodes when the light emitting means is illuminated so as to maintain

*the output FET in an ON state, such that the turn-off time of the output FET in response to the change of the bias switch from the second mode of operation to the first mode of operation is faster than the inherent turn-off time of the unbiased output FET.*

*18. A relay according to claim 17, wherein the biasing switch is a transistor.*

*19. A relay according to claim 18, wherein said biasing switch is a JFET.*

*20. A relay according to claim 18, wherein said biasing switch is a deletion-mode JFET.*

*21. A relay according to claim 17, further including means for biasing said biasing switch.*

*22. A relay according to claim 21, wherein said means for biasing includes a diode string.*

*23. A relay according to claim 22, wherein the diode string biases the biasing switch to the second mode of operation when the light emitting means is illuminated.*

*24. A solid state optically-coupled relay comprising,*

*(a) solid state light emitting means,*

*(b) principal solid state photodetector means comprising a first diode series array optically controllable by the light emitting means,*

*(c) output terminal means,*

*(d) a first enhancement-mode vertical conduction (DMOS) MOSFET, constituting a first output FET of the relay with gate, source and drain electrodes, a second enhancement-mode vertical conduction (DMOS) MOSFET, constituting a second output FET of the relay with gate, source and drain electrodes, wherein the source electrodes of the first and second output FETs are coupled together, the drain electrodes of the first and second output FETs are respectively coupled to said output terminal means and the source and gate electrodes of the first and second output FETs are coupled to the ends of the first diode array.*

* * * * *

UNITED STATES PATENT AND TRADEMARK OFFICE

CERTIFICATE OF CORRECTION

PATENT NO.: Re. 35,836

DATED: July 7, 1998

INVENTOR(S): Edward T. Rodriguez

It is certified that errors appear in the above-identified patent and that said Letters Patent is hereby corrected as shown below:

Claim 17, column 10, line 51, delete "out" and substitute therefor -- output --; and Claim 20, column 11, line 11, delete "deletion-mode" and substitute therefor -- depletion-mode --.

Signed and Sealed this

Twenty-second Day of September, 1998

*Attest:*

Bruce Lehman

BRUCE LEHMAN

*Attesting Officer*

*Commissioner of Patents and Trademarks*